United States Patent
Zhai et al.

(10) Patent No.: US 12,040,431 B2
(45) Date of Patent: Jul. 16, 2024

(54) METHOD FOR MANUFACTURING DISPLAY PANEL, DISPLAY PANEL, AND DISPLAY APPARATUS

(71) Applicant: CHONGQING KONKA PHOTOELECTRIC TECHNOLOGY RESEARCH INSTITUTE CO., LTD., Chongqing (CN)

(72) Inventors: Feng Zhai, Chongqing (CN); Biao Tang, Chongqing (CN)

(73) Assignee: CHONGQING KONKA PHOTOELECTRIC TECHNOLOGY RESEARCH INSTITUTE CO., LTD., Chongqing (CN)

(*) Notice: Subject to any disclaimer, the term of this patent is extended or adjusted under 35 U.S.C. 154(b) by 386 days.

(21) Appl. No.: 17/480,725

(22) Filed: Sep. 21, 2021

(65) Prior Publication Data
US 2022/0005977 A1 Jan. 6, 2022

Related U.S. Application Data

(63) Continuation of application No. PCT/CN2020/099791, filed on Jul. 1, 2020.

(51) Int. Cl.
*H01L 33/38* (2010.01)
*H01L 33/00* (2010.01)
(Continued)

(52) U.S. Cl.
CPC ........ *H01L 33/382* (2013.01); *H01L 33/0075* (2013.01); *H01L 33/04* (2013.01);
(Continued)

(58) Field of Classification Search
CPC ... H01L 33/382; H01L 33/0075; H01L 33/04; H01L 33/22; H01L 33/32; H01L 33/62;
(Continued)

(56) References Cited

U.S. PATENT DOCUMENTS

2005/0112340 A1  5/2005  Lu et al.
2007/0128825 A1  6/2007  Suga et a.
(Continued)

FOREIGN PATENT DOCUMENTS

CN   1763938 A   4/2006
CN   1790682 A   6/2006
(Continued)

OTHER PUBLICATIONS

English translation of international search report for PCT/CN2020/099791 (Year: 2021).*
(Continued)

*Primary Examiner* — J. E. Schoenholtz
(74) *Attorney, Agent, or Firm* — HAUPTMAN HAM, LLP

(57) ABSTRACT

A method for manufacturing a display panel (10), the display panel (10), and a display apparatus (20) are provided. The method includes the following. A first substrate (110) and a second substrate (120) are provided, where the first substrate (110) includes a growth substrate (111), an epitaxial structure (112), and a first metal layer (113) that are sequentially stacked, and the second substrate (120) includes a circuit substrate (121) and a second metal layer (122) stacked on the circuit substrate (121). An activation treatment is performed on the first metal layer (113) and the second metal layer (122). The first metal layer (113) and the second metal layer (122) are bonded after the activation treatment, to cause the growth substrate (111), the epitaxial structure (112), the first metal layer (113), the second metal layer (122), and the circuit substrate (121) sequentially stacked. The growth substrate (111) is lift off.

18 Claims, 7 Drawing Sheets

(51) Int. Cl.
   *H01L 33/04* (2010.01)
   *H01L 33/22* (2010.01)
   *H01L 33/32* (2010.01)
   *H01L 33/62* (2010.01)

(52) U.S. Cl.
   CPC .............. *H01L 33/22* (2013.01); *H01L 33/32* (2013.01); *H01L 33/62* (2013.01)

(58) Field of Classification Search
   CPC ................. H01L 33/007; H01L 33/44; H01L 2933/0016; H01L 2933/0066; H01L 27/153; H01L 33/42; H01L 33/0093
   See application file for complete search history.

(56) References Cited

U.S. PATENT DOCUMENTS

| | | | |
|---|---|---|---|
| 2015/0372054 A1* | 12/2015 | Schlereth | H01L 27/156 257/88 |
| 2016/0164024 A1 | 6/2016 | Takamuki | |
| 2019/0088633 A1* | 3/2019 | Tao | H01L 25/167 |
| 2019/0214257 A1 | 7/2019 | Lin | |

FOREIGN PATENT DOCUMENTS

| | | |
|---|---|---|
| CN | 102629656 A | 8/2012 |
| CN | 103887377 A | 6/2014 |
| CN | 105161515 A | 12/2015 |
| CN | 108140559 A | 6/2018 |
| CN | 108781064 A | 11/2018 |
| CN | 109830566 A | 5/2019 |
| CN | 110494983 A | 11/2019 |
| CN | 110707186 A | 1/2020 |
| CN | 111048634 A | 4/2020 |
| CN | 111192831 A | 5/2020 |
| JP | 20010060602 A | 3/2001 |
| WO | 2019160690 A1 | 8/2019 |

OTHER PUBLICATIONS

The first office action issued in corresponding CN application No. 202010625221.3 dated Nov. 30, 2021.
The second office action issued in corresponding CN application No. 202010625221.3 dated Apr. 22, 2022.
Notice of allowance issued in corresponding CN application No. 202010625221.3 dated Aug. 8, 2022.

* cited by examiner

METHOD FOR MANUFACTURING DISPLAY PANEL, DISPLAY PANEL, AND DISPLAY APPARATUS

CROSS-REFERENCE TO RELATED APPLICATION(S)

This application is a continuation of International Application No. PCT/CN2020/099791, filed on Jul. 1, 2020, the content of which is hereby incorporated by reference in its entirety.

TECHNICAL FIELD

This disclosure relates to the field of display technology, and particularly to a method for manufacturing a display panel, a display panel, and a display apparatus including the display panel.

BACKGROUND

In recent years, display technology has been developing, where transfer of epitaxial structures to circuit substrates through transfer technology has been a hot topic of research in the field of display technology.

Currently, the epitaxial structure on a growth substrate is generally transferred to the circuit substrate through wafer bonding technology. However, the related wafer bonding technology often chooses to bond the metal at 400° C. The thermal expansion coefficients of the circuit substrate and the growth substrate differ significantly, and delamination caused by thermal mismatch often occurs in the high-temperature bonding process, which affects the display quality.

Therefore, how to realize the low-temperature transfer of the epitaxial structure from the growth substrate to the circuit substrate to avoid the delamination caused by thermal mismatch in the high-temperature bonding process is a problem to be solved.

SUMMARY

Considering disadvantages of the related art described above, in the disclosure, a method for manufacturing a display panel, a display panel, and a display apparatus including the display panel are provided, to solve delamination caused by thermal mismatch in a high-temperature bonding process, due to a great difference between thermal expansion coefficients of a circuit substrate and a growth substrate, when an epitaxial structure on the growth substrate is transferred to the circuit substrate in high temperature.

According to a first aspect, a method for manufacturing a display panel is provided. The method includes the following. A first substrate and a second substrate are provided, where the first substrate includes a growth substrate, an epitaxial structure, and a first metal layer that are sequentially stacked, and the second substrate includes a circuit substrate and a second metal layer stacked on the circuit substrate. An activation treatment is performed on the first metal layer and the second metal layer. The first metal layer and the second metal layer are bonded after the activation treatment, to cause the growth substrate, the epitaxial structure, the first metal layer, the second metal layer, and the circuit substrate sequentially stacked. The growth substrate is lift off In the disclosure, the first metal layer and the second metal layer are provided. The activation treatment (or surface activation treatment) is performed on the first metal layer and the second metal layer. When the first metal layer and the second metal layer after the activation treatment are in mutual contact at room temperature, atomic diffusion occurs, to make the first metal layer and the second metal layer adhesively bonded, for transferring the epitaxial structure to the circuit substrate. In the disclosure, the bonding process is performed at room temperature, which avoids the delamination caused by thermal mismatch, resulted with a great difference between the thermal expansion coefficients of the circuit substrate and the growth substrate, in the high-temperature bonding process, improving display performance of the display panel.

In some implementations, the first metal layer includes a first surface away from the growth substrate, and the second metal layer includes a second surface away from the circuit substrate. The activation treatment is performed on the first metal layer as follows. The activation treatment is performed on the first surface. The activation treatment is performed on the second metal layer as follows. The activation treatment is performed on the second surface. The first metal layer and the second metal layer after the activation treatment are bonded as follows. The first surface and the second surface are bonded. The surface activation treatment may include an ion beam activation. During performing the surface activation treatment, the first surface and the second surface are activated, and metal atoms on the first surface and the second surface are activated. When the first surface is in contact with the second surface, the activated metal atoms diffuse to achieve a bonding connection.

In some implementations, the first metal layer includes a first metal sub-layer, a second metal sub-layer, and a third metal sub-layer that are sequentially stacked, and the first metal sub-layer is stacked on the epitaxial structure. The second metal layer includes a fourth metal sub-layer, a fifth metal sub-layer, and a sixth metal sub-layer that are sequentially stacked, and the sixth metal sub-layer is stacked on the circuit substrate. During performing the activation treatment on the first metal layer and the second metal layer, the whole third metal sub-layer and the whole fourth metal sub-layer are etched, and the second metal sub-layer and the fifth metal sub-layer are bonded. During performing the surface activation treatment on the first metal layer and the second metal layer, the whole third metal sub-layer on a surface of the first metal layer and the whole fourth metal sub-layer on a surface of the second metal layer can be etched. Compared with a partial etching process, a full etching process has less requirements on an activation technology. For example, when controlling a degree of etching via time of the surface activation treatment, the partial etching process has a strict control on conditions (such as time) of the activation technology, because the third metal sub-layer remained in a valley need to be no higher than a ridge to guarantee that the second metal sub-layer and the fifth metal sub-layer can contact mutually, increasing operation difficulties. In contrast, the full etching process can choose longer time for etching, and there is no need to consider a remaining state of the third metal sub-layer and the fourth metal sub-layer, which is flexible and is easy to operate.

In some implementations, the first metal layer includes a first metal sub-layer, a second metal sub-layer, and a third metal sub-layer that are sequentially stacked, and the first metal sub-layer is stacked on the epitaxial structure. The second metal layer includes a fourth metal sub-layer, a fifth metal sub-layer, and a sixth metal sub-layer that are sequentially stacked, and the sixth metal sub-layer is stacked on the circuit substrate. During performing the surface activation treatment on the first metal layer and the second metal layer, a part of the third metal sub-layer is etched to expose the second metal sub-layer, a part of the fourth metal sub-layer is etched to expose the fifth metal sub-layer, a remaining third metal sub-layer and a remaining fourth metal sub-layer are bonded, and the exposed second metal sub-layer and the exposed fifth metal sub-layer are bonded.

During performing the surface activation treatment on the first metal layer and the second metal layer, the third metal sub-layer on the surface of the first metal layer and the fourth metal sub-layer on the surface of the second metal layer are etched. By controlling the activation technology, the part of the third metal sub-layer and the part of the fourth metal sub-layer are etched (i.e., a remaining part of the third metal sub-layer is remained on the first metal layer, and a remaining part of the fourth metal sub-layer is remained on the second metal layer). By controlling a roughness of surfaces of the second metal sub-layer and the fifth metal sub-layer, the second metal sub-layer and the fifth metal sub-layer both have a greater roughness, such that surfaces of the second metal sub-layer and the fifth metal sub-layer include a ridge and a valley. During performing the activation treatment, the remaining part of the third metal sub-layer on a surface of the second metal sub-layer and the remaining part of the fourth metal sub-layer on a surface of the fifth metal sub-layer can be remained. During performing the bonding, the remaining part of the third metal sub-layer and the remaining part of the fourth metal sub-layer on surfaces of the second metal sub-layer and the fifth metal sub-layer are bonded mutually, and the second metal sub-layer and the fifth metal sub-layer are bonded mutually. Due to double bonding of the exposed second metal sub-layer and the exposed fifth metal sub-layer as well as the remaining third metal sub-layer and the remaining fourth metal sub-layer, bonding intensities can be increased.

In some implementations, during the partial etching process, the second metal sub-layer has a surface facing the third metal sub-layer, and the surface of the second metal sub-layer includes a first ridge and a first valley, and the fifth metal sub-layer has a surface facing the fourth metal sub-layer, and the surface of the fifth metal sub-layer includes a second ridge and a second valley. During performing the surface activation treatment on the first metal layer and the second metal layer, the part of the third metal sub-layer is etched, to expose the first ridge and a part of the first valley of the second metal sub-layer, where the remaining third metal sub-layer remains in the other part of the first valley, and the part of the fourth metal sub-layer is etched, to expose the second ridge and a part of the second valley of the fifth metal sub-layer, where the remaining fourth metal sub-layer remains in the other part of the second valley. The exposed first ridge and the exposed part of the first valley are bonded with the exposed second ridge and the exposed part of the second valley, and the remaining third metal sub-layer remained in the other part of the first valley is bonded with the remaining fourth metal sub-layer remained in the other part of the second valley. This double bonding of the second metal sub-layer and the fifth metal sub-layer as well as the remaining part of the third metal sub-layer and the remaining part of the fourth metal sub-layer increases bonding intensities.

In some implementations, the first metal sub-layer, the third metal sub-layer, the fourth metal sub-layer, and the sixth metal sub-layer each are made of titanium. The first metal layer and the second metal layer both have a three-layer metal structure. Titanium has a certain adhesive effect. Since a bonding effect of the second metal sub-layer directly deposited on the epitaxial structure or the fifth metal sub-layer directly deposited on the circuit substrate is undesired, by disposing a layer of titanium on each of the circuit substrate and the epitaxial structure (i.e., the first metal sub-layer and the sixth metal sub-layer each are a layer of titanium), the second metal sub-layer and the epitaxial structure can be bonded as well as the fifth metal sub-layer and the circuit substrate can be bonded, thus increasing bonding intensities between layers. The third metal sub-layer and the fourth metal sub-layer each are made of titanium. On the one side, titanium protects the second metal sub-layer and the fifth metal sub-layer from forming or adhering with an organic film layer or impurities on their surfaces when the second metal sub-layer and the fifth metal sub-layer are exposed directly in the environment, which will make it difficult to perform the activation treatment on the surfaces of the second metal sub-layer and the fifth metal sub-layer. On the other side, during performing the activation treatment, a part of titanium of the third metal sub-layer and a part of titanium of the fourth metal sub-layer can be remained, such that double bonding (bonding of the second metal sub-layer and the fifth metal sub-layer and bonding of the remaining third metal sub-layer and the remaining fourth metal sub-layer) increases bonding intensities.

In some implementations, the second metal sub-layer and the fifth metal sub-layer each are made of a same material of platinum, gold, copper, or aluminum. Metals such as platinum, gold, copper, or aluminum are easy to be activated, and the activated platinum atoms, gold atoms, copper atoms, or aluminum atoms are easy to occur atomic diffusion to realize the bonding connection.

In some implementations, the second metal sub-layer and the fifth metal sub-layer both have a roughness within 1-10 nanometers (nm). The roughnesses of the second metal sub-layer and the fifth metal sub-layer can affect the bonding process. If the roughnesses of the second metal sub-layer and the fifth metal sub-layer are greater than 10 nm, which are too great, surface undulation of the second metal sub-layer and the fifth metal sub-layer is greater, and thus contact areas are smaller when the second metal sub-layer and the fifth metal sub-layer are bonded mutually, affecting the bonding intensities. The roughnesses of the second metal sub-layer and the fifth metal sub-layer are smaller than 1 nm, which is difficult for adhesion of other materials.

In some implementations, the first metal sub-layer and the sixth metal sub-layer both have a thickness within 20-100 nm, in a direction perpendicular to a plane where the display panel is located. If the first metal sub-layer and the sixth metal sub-layer both have the thickness smaller than 20 nm, the bonding effect is weak. If the first metal sub-layer and the sixth metal sub-layer both have the thickness greater than 100 nm, the ohmic contact resistance is high and a thickness of the display panel is increased, which is not conducive to light-weight of the display panel.

In some implementations, the second metal sub-layer and the fifth metal sub-layer both have a thickness within 50-150 nm, in the direction perpendicular to the plane where the display panel is located. If the second metal sub-layer and the fifth metal sub-layer both have the thickness smaller than 50 nm, due to a lower conductivity of platinum of the second metal sub-layer and the fifth metal sub-layer, too thin second metal sub-layer and fifth metal sub-layer leads to great resistance of the second metal sub-layer and the fifth metal sub-layer and an obvious thermal effect. If the second metal sub-layer and the fifth metal sub-layer both have the thickness greater than 150 nm, since the thickness is too thick, the difficulty in etching is increased.

In some implementations, the third metal sub-layer and the fourth metal sub-layer before etching both have a thickness within 10-50 nm, in the direction perpendicular to the plane where the display panel is located. If the third metal sub-layer and the fourth metal sub-layer both have the thickness smaller than 10 nm, which is too thin, the third metal sub-layer and the fourth metal sub-layer are unevenly distributed, and thus the third metal sub-layer and the fourth metal sub-layer may not be respectively deposited in some areas of the second metal sub-layer and the fifth metal sub-layer. If the third metal sub-layer and the fourth metal sub-layer both have the thickness greater than 50 nm, which is too thick, an activation effect of the second metal layer is affected.

In some implementations, the method for manufacturing the display panel further includes the following operations. The display panel after lifting off the growth substrate is etched and an outer surface of the display panel after etching is deposited with a passivation layer. The passivation layer is deposited with an indium tin oxide (ITO) layer. A high-temperature annealing treatment is performed on the ITO layer. The passivation layer may be a silica passivation layer. During performing the high-temperature annealing treatment on the ITO layer (in this case, the growth substrate is lift off and thus there is no need to consider the delamination caused by the great difference between the thermal expansion coefficients of the circuit substrate and the growth substrate in high temperature), a bonding layer is also in a high temperature environment, which can further reinforce bonding of the first metal layer and the second metal layer after bonding in low temperature, increasing the bonding intensities.

According to a second aspect, based on a same inventive concept, a display panel is provided in the disclosure. The display panel includes a second substrate and a plurality of epitaxy structures arranged on the second substrate in an array. The plurality of epitaxy structures each includes an epitaxial structure and a first metal layer that are sequentially stacked. The second substrate includes a circuit substrate and a second metal layer stacked on the circuit substrate. The first metal layer is bonded with the second metal layer, where both the first metal layer and the second metal layer are subjected to an activation treatment.

In the disclosure, the first metal layer and the second metal layer are set to be bonded at room temperature. When the first metal layer and the second metal layer are in mutual contact at room temperature, atomic diffusion occurs, to make the first metal layer and the second metal layer adhesively bonded, for transferring the epitaxial structure to the circuit substrate. In the disclosure, the bonding process is performed at room temperature, which avoids the delamination caused by thermal mismatch, resulted with a great difference between the thermal expansion coefficients of the circuit substrate and the growth substrate, in the high-temperature bonding process, improving display performance of the display panel.

In some implementations, the circuit substrate defines a plurality of grooves, and the plurality of grooves each have a bottom provided with a first electrode. The second metal layer stacked on the circuit substrate is filled in the groove and connected with the first electrode. The first metal layer and the second metal layer form a conductor after bonding, and the epitaxial structure is electronically connected with the first electrode via the conductor. The first electrode is a positive electrode and may be an aluminum electrode. The first metal layer and the second metal layer are conductors. The epitaxial structure is electronically connected with the first electrode via the conductor. As such, circuit conduction is achieved, and there is no need to set other conductive structures to electronically connect the epitaxial structure with the first electrode, simplifying the process and decreasing costs.

In some implementations, the epitaxial structure has a side away from the first metal layer, the side of the epitaxial structure is provided with a second electrode, and the epitaxial structure is electronically connected with the second electrode. Two sides of the epitaxial structure can electronically connect with the first electrode and the second electrode, respectively, realizing the circuit conduction.

In an implementation, the epitaxial structure includes a P-type epitaxial layer, a multiple-quantum well layer, and an N-type epitaxial layer that are sequentially stacked. The P-type epitaxial layer is located on the first metal layer and is electronically connected with the first electrode via the conductor. The N-type epitaxial layer is electronically connected with the second electrode. A hole of the P-type epitaxial layer and an electron of the N-type epitaxial layer are recombined at the multiple-quantum well layer, to generate a photon for emitting light. The P-type epitaxial layer can be electronically connected with the first electrode via the first metal layer and the second metal layer after bonding. The N-type epitaxial layer is directly electronically connected with the second electrode. In the disclosure, the display panel may adopt a common cathode design, and the second electrode is an ITO conductive layer.

According to a third aspect, based on a same inventive concept, in the disclosure, a display apparatus is provided. The display apparatus includes the above-mentioned display panel of any of implementations.

Reference numbers in the figures are illustrated as follows.

10: display panel; 20: display apparatus; 110: first substrate; 120: second substrate; 111: growth substrate; 112: epitaxial structure; 113: first metal layer; 121: circuit substrate; 122: second metal layer; 1131: first surface; 1221: second surface; 1132: first metal sub-layer; 1133: second metal sub-layer; 1134: third metal sub-layer; 1222: fourth metal sub-layer; 1223: fifth metal sub-layer; 1224: sixth metal sub-layer; 1141: first wave ridge; 1142: first wave valley; 1143: second wave ridge; 1144: second wave valley; 1121: P-type epitaxial layer; 1122: multiple-quantum well layer; 1123: N-type epitaxial layer; 116: passivation layer; 117: ITO conductive layer; 118: first electrode; 119: conductor; 1211: groove; 130: epitaxy structure.

DETAILED DESCRIPTION

In order to understand the present disclosure, a detailed description will now be given with reference to the relevant accompanying drawings. The accompanying drawings illustrate better examples of implementations of the present disclosure. However, the present disclosure can be implemented in many different forms and is not limited to the implementations described herein. On the contrary, these implementations are provided for a more thorough and comprehensive understanding of the present disclosure.

Unless otherwise defined, all technical and scientific terms used herein have the same meaning as commonly understood by those skilled in the art of the present disclosure. The terms used herein in the disclosure are for the purpose of describing implementations only and are not intended to limit the disclosure.

Currently, the epitaxial structure on a growth substrate is generally transferred to the circuit substrate through wafer bonding technology. However, the related wafer bonding technology often chooses to bond the metal at 400° C. The thermal expansion coefficients of the circuit substrate and the growth substrate differ significantly, and the delamination caused by thermal mismatch often occurs in the high-temperature bonding process, which affects the display quality.

Based on the above, a solution is provided in the disclosure, to solve the above-mentioned technical problems. The solution will be explained in details in the following implementations.

Figure 1:
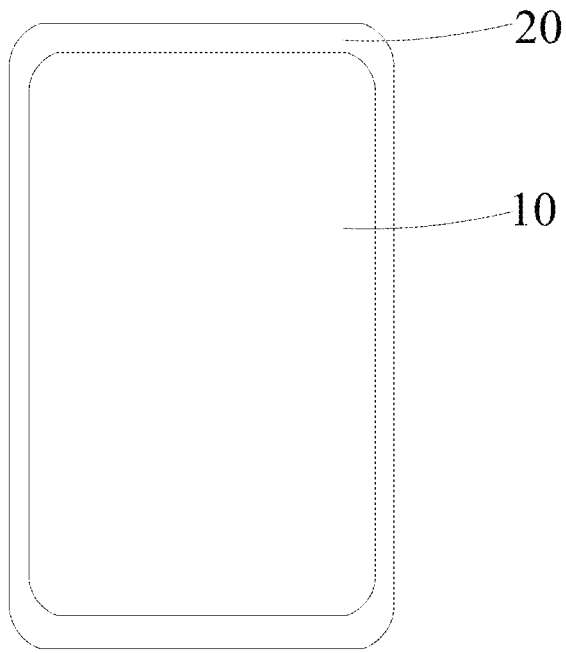
FIG. 1 is a schematic structural diagram illustrating a display panel applied to a display apparatus according to implementations of the disclosure.

A method for manufacturing a display panel, a display panel, and a display apparatus including the display panel are provided in the disclosure. FIG. 1 is a schematic structural diagram illustrating a display panel applied to a display apparatus according to implementations of the disclosure. As illustrated in FIG. 1, a display panel 10 is located in a display apparatus 20. The display apparatus 20 may be a mobile phone, a tablet computer, a television, a display, a laptop computer, a navigator and any other products or components with display functions.

Figure 2:
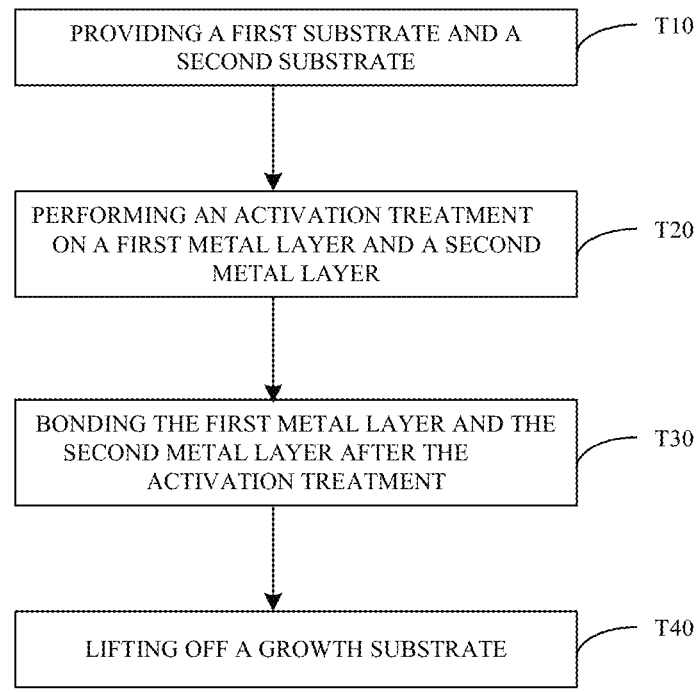
FIG. 2 is a schematic flowchart illustrating a method for manufacturing a display panel according to implementations of the disclosure.

In the disclosure, the method for manufacturing a display panel is provided, as illustrated in FIG. 2, the method for manufacturing a display panel in an implementation includes the following operations.

At block T10, a first substrate and a second substrate are provided.

Figure 3A:
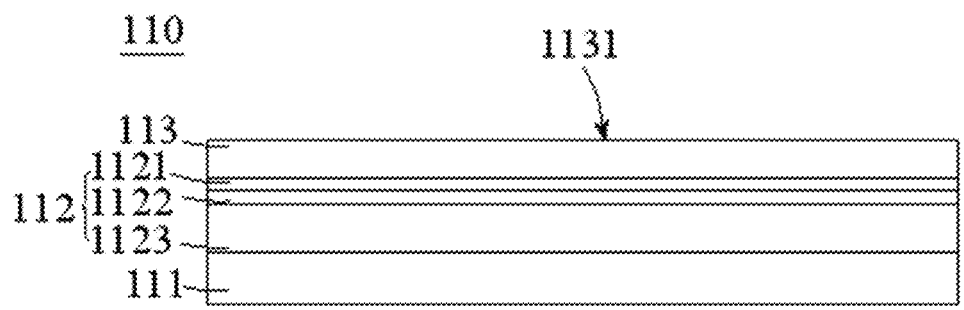
FIG. 3a-FIG. 3d are schematic structural diagrams illustrating a display panel after implementing operations in FIG. 2 according to implementations of the disclosure.
Figure 3B:
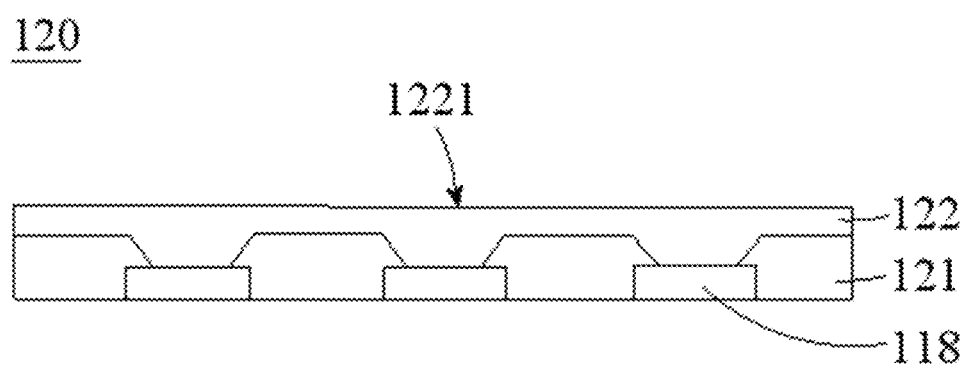

As illustrated in FIG. 3a and FIG. 3b, the first substrate 110 includes a growth substrate 111, an epitaxial structure 112, and a first metal layer 113 that are sequentially stacked, and the second substrate 120 includes a circuit substrate 121 and a second metal layer 122 stacked on the circuit substrate 121. The epitaxial structure 112 is etched to form a light emitting diode (LED).

At block T20, an activation treatment is performed on the first metal layer and the second metal layer.

At block T30, the first metal layer and the second metal layer are bonded after the activation treatment.

Figure 3C:
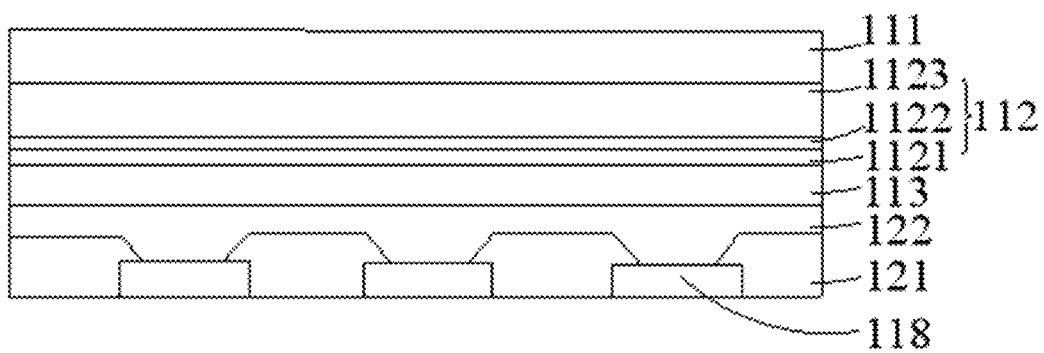

As illustrated in FIG. 3c, after the first metal layer 113 and the second metal layer 122 are bonded, the growth substrate 111, the epitaxial structure 112, the first metal layer 113, the second metal layer 122, and the circuit substrate 121 are sequentially stacked.

At block T40, the growth substrate is lift off.

Figure 3D:
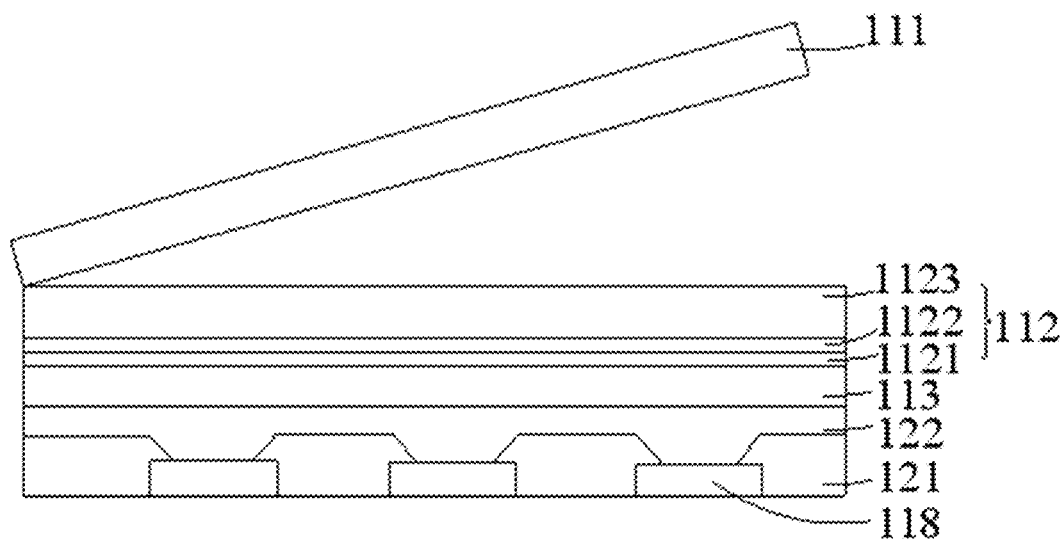

As illustrated in FIG. 3d, the epitaxial structure 112 is transferred to the circuit substrate 121 after peeling off the growth substrate 111.

In the disclosure, the first metal layer 113 and the second metal layer 122 are provided. The surface activation treatment is performed on the first metal layer 113 and the second metal layer 122. When the first metal layer 113 and the second metal layer 122 after the activation treatment are in mutual contact at room temperature, atomic diffusion occurs, to make the first metal layer 113 and the second metal layer 122 adhesively bonded, for transferring the epitaxial structure 112 to the circuit substrate 121. In the disclosure, the bonding process is performed at room temperature, which avoids the delamination caused by thermal mismatch, resulted with a great difference between the thermal expansion coefficients of the circuit substrate 121 and the growth substrate 111, in the high-temperature bonding process, improving display performance of the display panel 10.

As illustrated in FIG. 3a and FIG. 3b, the first metal layer 113 includes a first surface 1131 away from the growth substrate 111, and the second metal layer 122 includes a second surface 1221 away from the circuit substrate 121. The activation treatment is performed on the first metal layer 113 as follows. The activation treatment is performed on the first surface 1131. The activation treatment is performed on the second metal layer 122 as follows. The activation treatment is performed on the second surface 1221. The first metal layer 113 and the second metal layer 122 after the activation treatment are bonded as follows. The first surface 1131 and the second surface 1221 are bonded. The surface activation treatment may include ion beam activation. During performing the surface activation treatment, the first surface 1131 and the second surface 1221 are activated, and metal atoms on the first surface 1131 and the second surface 1221 are activated. When the first surface 1131 is in contact with the second surface 1221, the activated metal atoms diffuse to achieve a bonding connection.

Figure 4A:
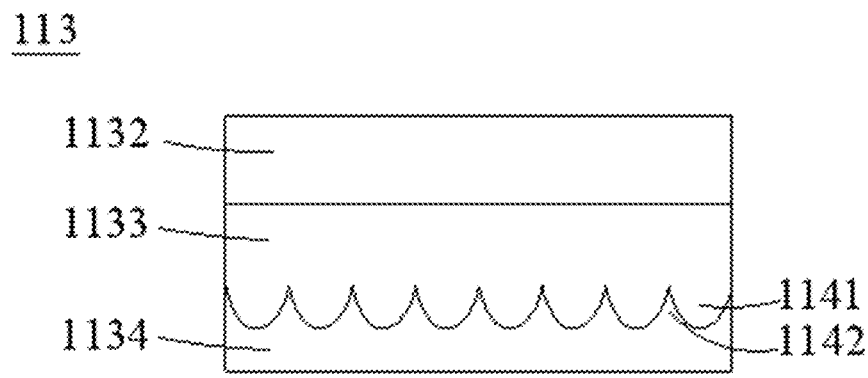
FIG. 4a-FIG. 4c are schematic structural diagrams illustrating a bonding structure subjected to a partial etching process according to implementations of the disclosure.
Figure 4B:
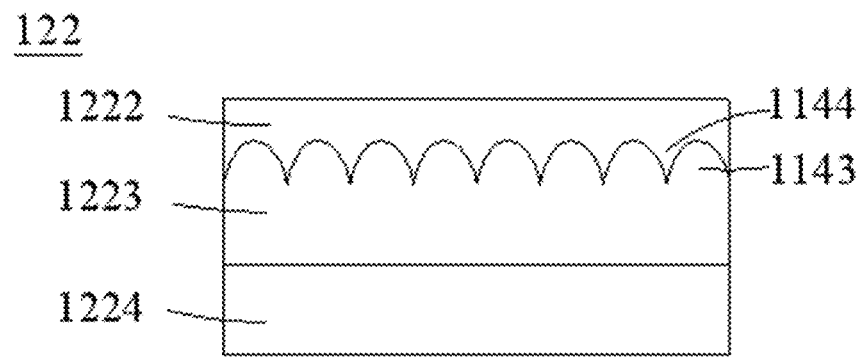
Figure 4C:
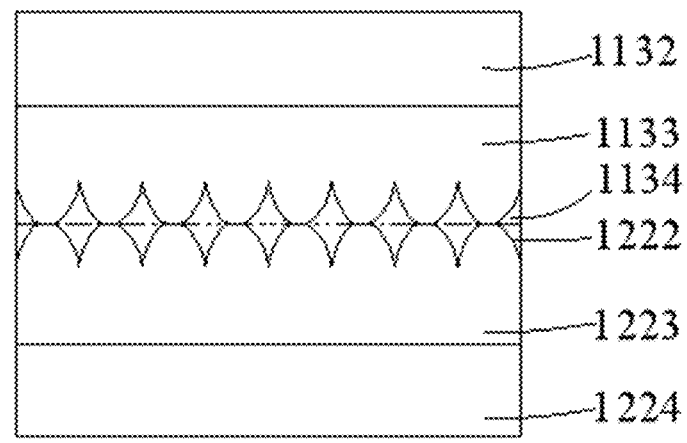
Figure 5:
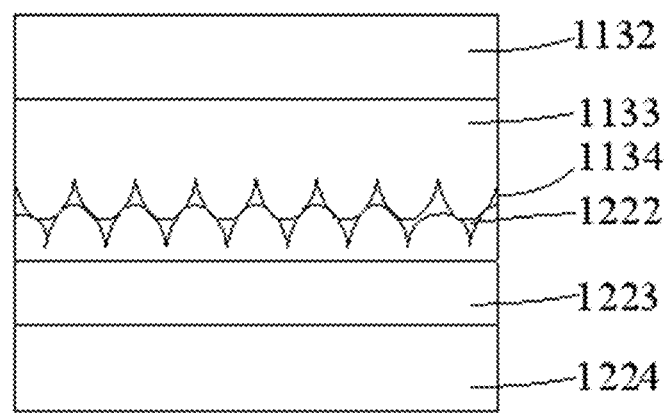
FIG. 5 is a schematic structural diagram illustrating a bonding structure subjected to a partial etching process according to other implementations of the disclosure.

As illustrated in FIG. 4a and FIG. 4b, in the disclosure, the first metal layer 113 and the second metal layer 122 both have a three-layer metal structure. the first metal layer 113 includes a first metal sub-layer 1132, a second metal sub-layer 1133, and a third metal sub-layer 1134 that are sequentially stacked, and the first metal sub-layer 1132 is stacked on the epitaxial structure 112. The second metal layer 122 includes a fourth metal sub-layer 1222, a fifth metal sub-layer 1223, and a sixth metal sub-layer 1224 that are sequentially stacked, and the sixth metal sub-layer 1224 is stacked on the circuit substrate 121.

In an example, the first metal sub-layer 1132, the second metal sub-layer 1133, and the third metal sub-layer 1134 can be sequentially deposited on the epitaxial structure 112 via an electron beam evaporation technique. The fourth metal sub-layer 1222, the fifth metal sub-layer 1223, and the sixth metal sub-layer 1224 can be sequentially deposited on the circuit substrate 121 via the electron beam evaporation technique.

The first metal sub-layer 1132 of the first metal layer 113, the third metal sub-layer 1134, the fourth metal sub-layer 1222 of the second metal layer 122, and the sixth metal sub-layer 1224 may be made of titanium. The first metal sub-layer 1132 and the sixth metal sub-layer 1224 are made of titanium. Titanium has a certain adhesive effect. Since a bonding effect of the second metal sub-layer 1133 directly deposited on the epitaxial structure 112 or the fifth metal sub-layer 1223 directly deposited on the circuit substrate 121 is undesired, by disposing a layer of titanium on each of the circuit substrate 121 and the epitaxial structure 112 (i.e., the first metal sub-layer 1132 and the sixth metal sub-layer 1224 each are a layer of titanium), the second metal sub-layer 1133 and the epitaxial structure 112 can be bonded as well as the fifth metal sub-layer 1223 and the circuit substrate 121 can be bonded, thus increasing bonding intensities between layers. The third metal sub-layer 1134 and the fourth metal sub-layer 1222 each are made of titanium. On the one side, titanium protects the second metal sub-layer 1133 and the fifth metal sub-layer 1223 from forming or adhering with an organic film layer or impurities on their surfaces when the second metal sub-layer 1133 and the fifth metal sub-layer 1223 are exposed directly on the environment, which will make it difficult to perform the activation treatment on the surfaces of the second metal sub-layer 1133 and the fifth metal sub-layer 1223. On the other side, during performing the activation treatment, a part of titanium of the third metal sub-layer 1134 and a part of titanium of the fourth metal sub-layer 1222 can be remained, such that double bonding (bonding of the second metal sub-layer 1133 and the fifth metal sub-layer 1223 and bonding of the remaining third metal sub-layer 1134 and the remaining fourth metal sub-layer 1222) increases bonding intensities.

The second metal sub-layer 1133 of the first metal layer 113 and the fifth metal sub-layer 1223 of the second metal layer 122 each are made of a same material of platinum, gold, copper, or aluminum. Metals such as platinum, gold, copper, or aluminum are easy to activate, and the activated platinum atoms, gold atoms, copper atoms, or aluminum atoms are easy to occur atomic diffusion to realize the bonding connection.

In the disclosure, there are two solutions for bonding the first metal layer 113 and the second metal layer 122. The solutions include the following.

For the first solution, during performing the surface activation treatment on the first metal layer 113 and the second metal layer 122, the whole third metal sub-layer 1134 and the whole fourth metal sub-layer 1222 are etched, and the second metal sub-layer 1133 and the fifth metal sub-layer 1223 are bonded.

During performing the surface activation treatment on the first metal layer 113 and the second metal layer 122, the whole third metal sub-layer 1134 on a surface of the first metal layer 113 and the whole fourth metal sub-layer 1222 on a surface of the second metal layer 122 can be etched. Compared with a partial etching process, a full etching process has less requirements on an activation technology. For example, when controlling a degree of etching via time of the surface activation treatment, the partial etching process has a strict control on conditions (such as time) of the activation technology, because the third metal sub-layer 1134 remained in a valley need to be no higher than a ridge to guarantee that the second metal sub-layer 1133 and the fifth metal sub-layer 1223 can contact mutually, increasing operation difficulties. In contrast, the full etching process can choose longer time for etching, and there is no need to consider a remaining state of the third metal sub-layer 1134 and the fourth metal sub-layer 1222, which is flexible and is easy to operate.

For the second solution, with reference of FIG. 4a, FIG. 4b, FIG. 4c, and FIG. 5, during performing the surface activation treatment on the first metal layer 113 and the second metal layer 122, a part of the third metal sub-layer 1134 is etched to expose the second metal sub-layer 1133, a part of the fourth metal sub-layer 1222 is etched to expose the fifth metal sub-layer 1223, a remaining third metal sub-layer 1134 and a remaining fourth metal sub-layer 1222 are bonded, and the exposed second metal sub-layer 1133 and the exposed fifth metal sub-layer 1223 are bonded.

During performing the surface activation treatment on the first metal layer 113 and the second metal layer 122, the third metal sub-layer 1134 on the surface of the first metal layer 113 and the fourth metal sub-layer 1222 on the surface of the second metal layer 122 are etched. By controlling the activation technology, the part of the third metal sub-layer 1134 and the part of the fourth metal sub-layer 1222 are etched (i.e., a remaining part of the third metal sub-layer 1134 remained on the first metal layer 113 and a remaining part of the fourth metal sub-layer 1222 remained on the second metal layer 122). By controlling a roughness of surfaces of the second metal sub-layer 1133 and the fifth metal sub-layer 1223, the second metal sub-layer 1133 and the fifth metal sub-layer 1223 have greater roughness, such that surfaces of the second metal sub-layer 1133 and the fifth metal sub-layer 1223 include a ridge and a valley. During performing the activation treatment, the remaining part of the third metal sub-layer 1133 on a surface of the second metal sub-layer 1133 and the remaining part of the fourth metal sub-layer 1222 on a surface of the fifth metal sub-layer 1223 can be remained. During performing the bonding, the remaining part of the third metal sub-layer 1134 on a surface of the second metal sub-layer 1133 and the remaining part of the fourth metal sub-layer 1222 on a surface of the fifth metal sub-layer 1223 are bonded mutually, and the second metal sub-layer 1133 and the fifth metal sub-layer 1223 are bonded mutually. Due to double bonding of the remaining part of the third metal sub-layer 1134 and the remaining part of the fourth metal sub-layer 1222 as well as the second metal sub-layer 1133 and the fifth metal sub-layer 1223, bonding intensities can be increased.

It should be understood that, with reference of FIG. 4a, FIG. 4b, FIG. 4c, and FIG. 5, during the partial etching process, the second metal sub-layer 1133 has a surface facing the third metal sub-layer 1134, and the surface of the second metal sub-layer 1133 includes a first ridge 1141 and a first valley 1142, and the fifth metal sub-layer 1223 has a surface facing the fourth metal sub-layer 1222, and the surface of the fifth metal sub-layer 1223 includes a second ridge 1143 and a second valley 1144. During performing the surface activation treatment on the first metal layer 113 and the second metal layer 122, the part of the third metal sub-layer 1134 is etched, to expose the first ridge 1141 and a part of the first valley 1142 of the second metal sub-layer 1133, where the remaining third metal sub-layer 1134 remains in the other part of the first valley 1142, and the part of the fourth metal sub-layer 1222 is etched, to expose the second ridge 1143 and a part of the second valley 1144 of the fifth metal sub-layer 1223, where the remaining fourth metal sub-layer 1222 remains in the other part of the second valley 1144. The exposed first ridge 1141 and the exposed part of the first valley 1142 are bonded with the exposed second ridge 1143 and the exposed part of the second valley 1144, and the remaining third metal sub-layer 1134 remained in the other part of the first valley 1142 is bonded with the remaining fourth metal sub-layer 1222 remained in the other part of the second valley 1144.

The second metal sub-layer 1133 and the fifth metal sub-layer 1223 both have a roughness, which is important to the bonding technology. The second metal sub-layer 1133 and the fifth metal sub-layer 1223 both have a roughness within 1-10 nanometers (nm). The roughnesses of the second metal sub-layer 1133 and the fifth metal sub-layer 1223 can affect the bonding process. If the roughnesses of the second metal sub-layer 1133 and the fifth metal sub-layer 1223 are greater than 10 nm, which are too great, surface undulation of the second metal sub-layer 1133 and the fifth metal sub-layer 1223 is greater, and thus contact areas are smaller when the second metal sub-layer 1133 and the fifth metal sub-layer 1223 are bonded mutually, affecting the bonding intensities. The roughnesses of the second metal sub-layer 1133 and the fifth metal sub-layer 1223 are smaller than 1 nm, which is difficult for adhesion of other materials.

In the disclosure, the first metal layer 113 and the second metal layer 122 both have a multi-layer metal structure, and a Nano-sized thickness, as described in the following.

The first metal sub-layer 1132 and the sixth metal sub-layer 1224 both have a thickness within 20-100 nm, in a direction perpendicular to a plane where the display panel is located. If the first metal sub-layer 1132 and the sixth metal sub-layer 1224 both have the thickness smaller than 20 nm, the bonding effect is weak. If the first metal sub-layer 1132 and the sixth metal sub-layer 1224 both have the thickness greater than 100 nm, the ohmic contact resistance is high and a thickness of the display panel is increased, which is not conducive to light-weight of the display panel.

The second metal sub-layer 1133 and the fifth metal sub-layer 1223 both have a thickness within 50-150 nm, in the direction perpendicular to the plane where the display panel is located. If the second metal sub-layer 1133 and the fifth metal sub-layer 1223 both have the thickness smaller than 50 nm, due to a lower conductivity of platinum of the second metal sub-layer 1133 and the fifth metal sub-layer 1223, too thin second metal sub-layer and fifth metal sub-layer leads to great resistance of the second metal sub-layer 1133 and the fifth metal sub-layer 1223 and an obvious thermal effect. If the second metal sub-layer 1133 and the fifth metal sub-layer 1223 both have the thickness greater than 150 nm, since the thickness is too thick, the difficulty in etching is increased.

The third metal sub-layer 1134 and the fourth metal sub-layer 1222 before etching both have a thickness within 10-50 nm, in the direction perpendicular to the plane where the display panel is located. If the third metal sub-layer 1134 and the fourth metal sub-layer 1222 both have the thickness smaller than 10 nm, which is too thin, the third metal sub-layer 1134 and the fourth metal sub-layer 1222 are unevenly distributed, and thus the third metal sub-layer 1134 and the fourth metal sub-layer 1222 may not be respectively deposited in some areas of the second metal sub-layer and the fifth metal sub-layer. If the third metal sub-layer 1134 and the fourth metal sub-layer 1222 both have the thickness greater than 50 nm, which is too thick, an activation effect of the second metal layer 122 is affected.

The growth substrate 111 may be a sapphire substrate, where the sapphire substrate can be lift off by adopting a laser lift off technology with simple operations, clean results, and less remains. In some examples, the growth substrate 111 may also be a gallium nitride substrate, a silicon substrate, a silicon carbide substrate, or the like, which can be lift off by adopting a chemical etching method. The epitaxial structure 112 is transferred to the circuit substrate 121 after peeling off the growth substrate 111.

Figure 6:
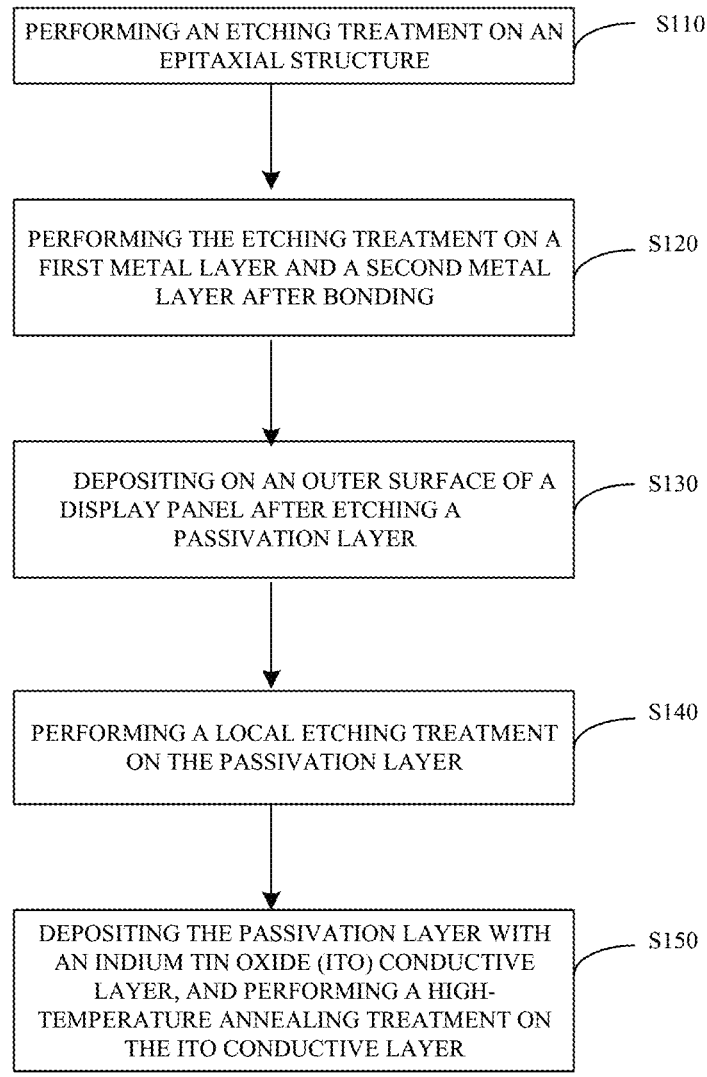
FIG. 6 is a schematic flowchart illustrating a method for manufacturing a display panel after transferring an epitaxial structure according to implementations of the disclosure.

As illustrated in FIG. 6, after peeling off the growth substrate 111, the method for manufacturing the display panel 10 further include the following.

At S110, an etching treatment is performed on the epitaxial structure.

Figure 7A:
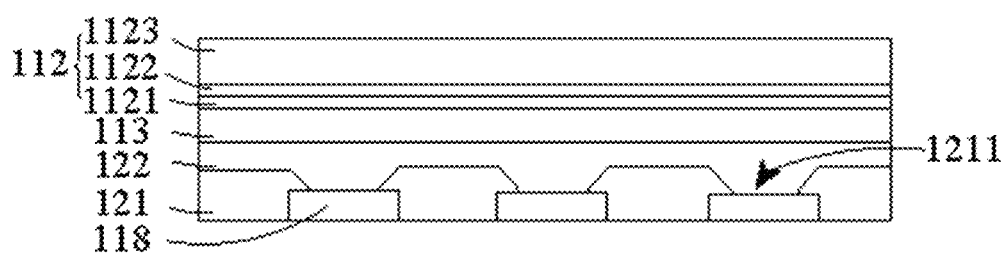
FIG. 7a-FIG. 7f are schematic structural diagrams illustrating a display panel after implementing operations in FIG. 6 according to implementations of the disclosure.
Figure 7B:
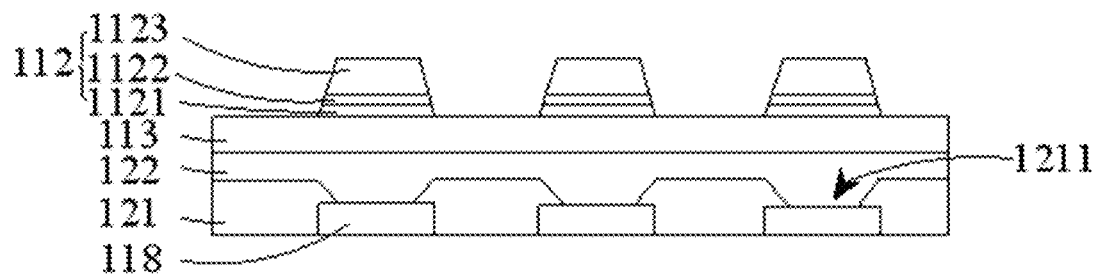

As illustrated in FIG. 7a and FIG. 7b, a directional etching treatment is performed on the epitaxial structure 112 at an N-type epitaxial structure 1123 of the epitaxial structure 112 by using a colloid crystal or a photoresist as an etching mask.

At S120, the etching treatment is performed on the first metal layer and the second metal layer after bonding.

Figure 7C:
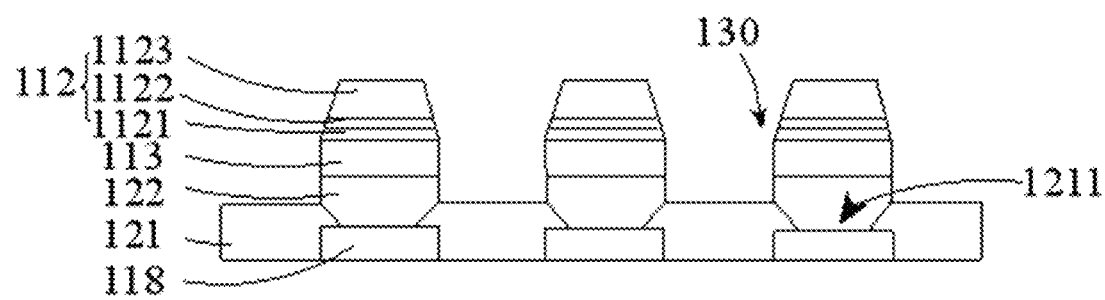

As illustrated in FIG. 7c, the epitaxial structure 112 is etched, and then the first metal layer 113 and the second metal layer 122 after bonding are etched to form an independent sub-pixel (i.e., an epitaxy structure 130). In other words, the etching treatment is performed on the epitaxial structure 112 between adjacent independent sub-pixels and the bonded first metal layer 113 and second metal layer 122. The epitaxial structure 112 is electrically connected with a first electrode 118 via the bonded first metal layer 113 and second metal layer 122.

Generally, the epitaxial structure 112 has a total thickness in a range of 4.6-5 microns (um). In addition, the thickness of the first metal layer 113 and the second metal layer 122 after bonding is relatively thin due to use of low temperature, and a relatively simple inductively coupled plasma etching is adopted, which avoids an over-etching effect of plasma gas on the N-type epitaxial layer 1123 due to etching a metal layer with a thickness of 2 um in the related technology, thus not affecting the performance of the display panel.

At S130, a passivation layer is deposited on an outer surface of the display panel after etching.

Figure 7D:
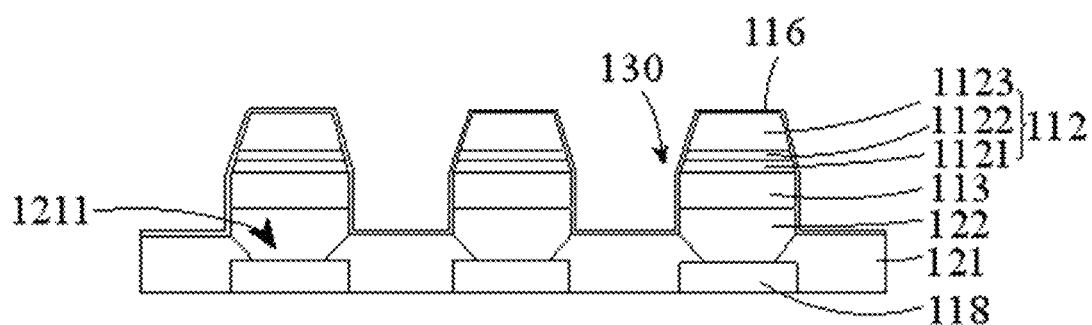

As illustrated in FIG. 7d, the passivation layer 116 may be silicon dioxide, and a deposition method may be chemical vapor deposition, and so on.

At S140, a local etching treatment is performed on the passivation layer.

Figure 7E:
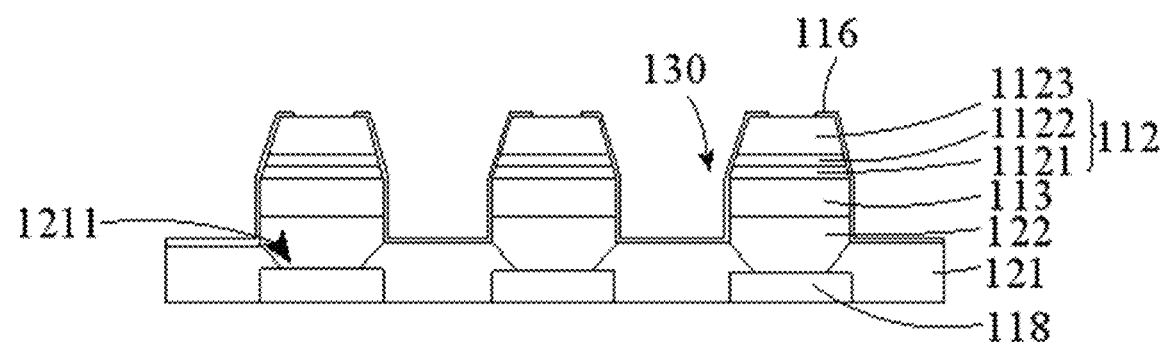

As illustrated in FIG. 7e, the local etching treatment is performed on the passivation layer by adopting inductively coupled plasma etching, to expose a cathode chamber (not shown in FIG. 7e) on a circuit and a part of the N-type epitaxial layer 1123.

At S150, the passivation layer is deposited with an indium tin oxide (ITO) conductive layer, and a high-temperature annealing treatment is performed on the ITO conductive layer.

Figure 7F:
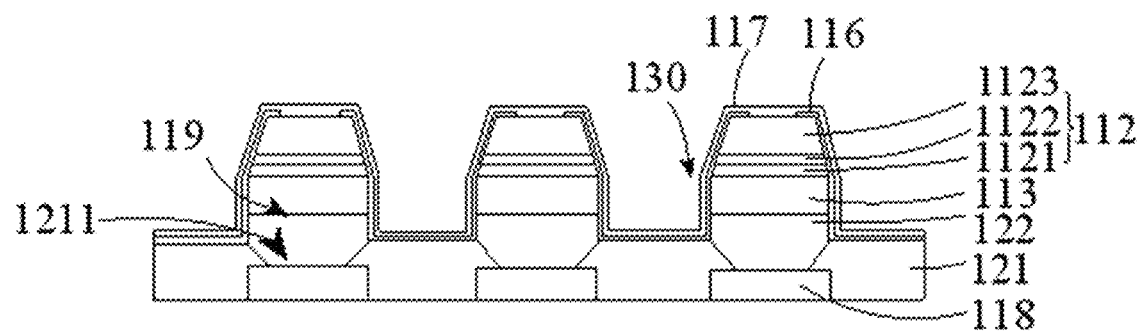

As illustrated in FIG. 7f, the ITO conductive layer can be deposited by adopting the chemical vapor deposition. By adopting a common cathode design, the ITO conductive layer becomes a transparent conductive network, to connect with N-type epitaxial layers 1123 of all sub-pixels and with the cathode of the circuit.

During performing the high-temperature annealing treatment on the ITO conductive layer (at this time, the growth substrate is lift off without the delamination caused by the great difference between the thermal expansion coefficients of the circuit substrate and the growth substrate in high temperature), the first metal layer 113 and the second metal layer 122 after bonding is also in a high temperature environment, which can further bond and reinforce the first metal layer 113 and the second metal layer 122 after bonding at room temperature, increasing the bonding intensities.

Based on a same inventive concept, a display panel is provided in the disclosure. The display panel includes the following.

FIG. 7c is a schematic structural diagram illustrating a display panel after etching according to implementations of the disclosure. As illustrated in FIG. 7c, the display panel 10 includes a second substrate 120 and a plurality of epitaxy structures 130 (the epitaxy structures 130 is the etched epitaxial structure 112 and first metal layer 113) arranged on the second substrate 120 in an array. The plurality of epitaxy structures 130 each includes an epitaxial structure 112 and a first metal layer 113 that are sequentially stacked. The second substrate 120 includes a circuit substrate 121 (the circuit substrate 121 may be a glass substrate, a silicon substrate, or the like) and a second metal layer 122 stacked on the circuit substrate 121. The first metal layer 113 is bonded with the second metal layer 122, where both the first metal layer 113 and the second metal layer 122 are subjected to an activation treatment.

The circuit substrate 121 defines a plurality of grooves 1211, and the plurality of grooves 1211 each have a bottom provided with a first electrode 118. The second metal layer 122 stacked on the circuit substrate 121 is filled in the groove 1211 and connected with the first electrode 118. The first metal layer 113 and the second metal layer 122 form a conductor 119 after bonding, and the epitaxial structure 112 is electronically connected with the first electrode 118 via the conductor 119. The epitaxial structure 112 has a side away from the first metal layer 113, the side of the epitaxial structure 112 is provided with a second electrode (i.e., an ITO conductive layer 117), and the epitaxial structure 112 is electronically connected with the second electrode.

As illustrated in FIG. 7f, the epitaxial structure 112 includes a P-type epitaxial layer 1121, a multiple-quantum well layer 1122, and an N-type epitaxial layer 1123 that are sequentially stacked. The P-type epitaxial layer 1121 is located on the first metal layer 113. A hole of the P-type epitaxial layer 1121 and an electron of the N-type epitaxial layer 1123 are recombined at the multiple-quantum well layer 1122 (i.e., a light emitting layer), to generate a photon for emitting light. The N-type epitaxial layer 1123 is electronically connected with the second electrode (i.e., the ITO conductive layer 117). The P-type epitaxial layer 1121 can be electronically connected with the first electrode 118 via the first metal layer 113 and the second metal layer 122 after bonding. As such, circuit conduction is achieved, and there is no need to set other conductive structures to electronically connect the epitaxial structure 112 with the first electrode 118, simplifying the process and decreasing costs.

The P-type epitaxial layer 1121 may be a P-gallium nitride (GaN), and the N-type epitaxial layer 1123 may be an N-GaN. The first electrode is a positive electrode and may be an aluminum electrode.

In the disclosure, the first metal layer 113 and the second metal layer 122 are set to be bonded at room temperature. When the first metal layer 113 and the second metal layer 122 are in mutual contact at room temperature, atomic diffusion occurs, to make the first metal layer 113 and the second metal layer 122 adhesively bonded, for transferring the epitaxial structure 112 to the circuit substrate 121. In the disclosure, the bonding process is performed at room temperature, which avoids the delamination caused by thermal mismatch, resulted with a great difference between the thermal expansion coefficients of the circuit substrate and the growth substrate, in the high-temperature bonding process, improving display performance of the display panel 10. In the disclosure, the epitaxial structure 112 is etched after transferring the epitaxial structure 112, without need for an alignment technology in the related technology, reducing the problem of alignment accuracy for the epitaxial structure transfer in the related technology.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for manufacturing a display panel, comprising:
providing a first substrate and a second substrate, wherein the first substrate comprises a growth substrate, an epitaxial structure, and a first metal layer that are sequentially stacked, and the second substrate comprises a circuit substrate and a second metal layer stacked on the circuit substrate;
performing an activation treatment on the first metal layer and the second metal layer;
bonding the first metal layer and the second metal layer after the activation treatment, to cause the growth substrate, the epitaxial structure, the first metal layer, the second metal layer, and the circuit substrate sequentially stacked; and
lifting off the growth substrate, wherein
the first metal layer comprises a first metal sub-layer, a second metal sub-layer, and a third metal sub-layer that are sequentially stacked, and the first metal sub-layer is stacked on the epitaxial structure;
the second metal layer comprises a fourth metal sub-layer, a fifth metal sub-layer, and a sixth metal sub-layer that are sequentially stacked, and the sixth metal sub-layer is stacked on the circuit substrate; and
one of:
during performing the activation treatment on the first metal layer and the second metal layer, etching away all of the third metal sub-layer and all of the fourth metal sub-layer, and bonding the second metal sub-layer and the fifth metal sub-layer; or
during performing the activation treatment on the first metal layer and the second metal layer, etching away a part of the third metal sub-layer to expose the second metal sub-layer, etching away a part of the fourth metal sub-layer to expose the fifth metal sub-layer, bonding a remaining third metal sub-layer and a remaining fourth metal sub-layer, and bonding the exposed second metal sub-layer and the exposed fifth metal sub-layer.

2. The method of claim 1, wherein the first metal layer comprises a first surface away from the growth substrate, and the second metal layer comprises a second surface away from the circuit substrate, and wherein
performing the activation treatment on the first metal layer comprises performing the activation treatment on the first surface;
performing the activation treatment on the second metal layer comprises performing the activation treatment on the second surface; and
bonding the first metal layer and the second metal layer after the activation treatment comprises bonding the first surface and the second surface.

3. The method of claim 1, wherein
the second metal sub-layer has a surface facing the third metal sub-layer, and the surface of the second metal sub-layer comprises a first ridge and a first valley, and the fifth metal sub-layer has a surface facing the fourth metal sub-layer, and the surface of the fifth metal sub-layer comprises a second ridge and a second valley; and
during performing the activation treatment on the first metal layer and the second metal layer, etching away the part of the third metal sub-layer to expose the second metal sub-layer, etching away the part of the fourth metal sub-layer to expose the fifth metal sub-layer, bonding the remaining third metal sub-layer and the remaining fourth metal sub-layer, and bonding the exposed second metal sub-layer and the exposed fifth metal sub-layer comprise:
- etching away the part of the third metal sub-layer, to expose the first ridge and a part of the first valley of the second metal sub-layer, wherein the remaining third metal sub-layer remains in the other part of the first valley;
- etching away the part of the fourth metal sub-layer, to expose the second ridge and a part of the second valley of the fifth metal sub-layer, wherein the remaining fourth metal sub-layer remains in the other part of the second valley;
- bonding the exposed first ridge and the exposed part of the first valley with the exposed second ridge and the exposed part of the second valley; and
- bonding the remaining third metal sub-layer remained in the other part of the first valley with the remaining fourth metal sub-layer remained in the other part of the second valley.

4. The method of claim 1, wherein the first metal sub-layer, the third metal sub-layer, the fourth metal sub-layer, and the sixth metal sub-layer each are made of titanium.

5. The method of claim 1, wherein the second metal sub-layer and the fifth metal sub-layer each are made of a same material of platinum, gold, copper, or aluminum.

6. The method of claim 1, wherein the second metal sub-layer and the fifth metal sub-layer both have a roughness within 1-10 nanometers (nm).

7. The method of claim 1, wherein the first metal sub-layer and the sixth metal sub-layer both have a thickness within 20-100 nm, in a direction perpendicular to a plane where the display panel is located.

8. The method of claim 1, wherein the second metal sub-layer and the fifth metal sub-layer both have a thickness within 50-150 nm, in a direction perpendicular to a plane where the display panel is located.

9. The method of claim 1, wherein the third metal sub-layer and the fourth metal sub-layer before etching both have a thickness within 10-50 nm, in a direction perpendicular to a plane where the display panel is located.

10. A display panel, comprising a second substrate and a plurality of epitaxy structures arranged on the second substrate in an array, wherein
the plurality of epitaxy structures each comprise an epitaxial structure and a first metal layer that are sequentially stacked;
the second substrate comprises a circuit substrate and a second metal layer stacked on the circuit substrate; and
the first metal layer is bonded with the second metal layer, wherein both the first metal layer and the second metal layer are subjected to an activation treatment, and wherein
the first metal layer comprises a first metal sub-layer and a second metal sub-layer that are sequentially stacked, and the first metal sub-layer is stacked on the epitaxial structure; the second metal layer comprises a fifth metal sub-layer and a sixth metal sub-layer that are sequentially stacked, and the sixth metal sub-layer is stacked on the circuit substrate; and the second metal sub-layer is bonded with the fifth metal sub-layer; or
the first metal layer comprises a first metal sub-layer, a second metal sub-layer, and a third metal sub-layer that are sequentially stacked, a part of the second metal sub-layer is exposed from the third metal sub-layer, and the first metal sub-layer is stacked on the epitaxial structure; the second metal layer comprises a fourth metal sub-layer, a fifth metal sub-layer, and a sixth metal sub-layer that are sequentially stacked, a part of the fifth metal sub-layer is exposed from the fourth metal sub-layer, and the sixth metal sub-layer is stacked on the circuit substrate; and the third metal sub-layer is bonded with the fourth metal sub-layer, and the part of the second metal sub-layer exposed is bonded with the part of the fifth metal sub-layer exposed.

11. The display panel of claim 10, wherein
the circuit substrate defines a plurality of grooves, and the plurality of grooves each have a bottom provided with a first electrode;
the second metal layer stacked on the circuit substrate is filled in the groove and connected with the first electrode; and
the first metal layer and the second metal layer form a conductor after bonding, and the epitaxial structure is electronically connected with the first electrode via the conductor.

12. The display panel of claim 11, wherein the epitaxial structure has a side away from the first metal layer, the side of the epitaxial structure is provided with a second electrode, and the epitaxial structure is electronically connected with the second electrode.

13. The display panel of claim 12, wherein the epitaxial structure comprises a P-type epitaxial layer, a multiple-quantum well layer, and an N-type epitaxial layer that are sequentially stacked, wherein
the P-type epitaxial layer is located on the first metal layer and is electronically connected with the first electrode via the conductor;
the N-type epitaxial layer is electronically connected with the second electrode; and
a hole of the P-type epitaxial layer and an electron of the N-type epitaxial layer are recombined at the multiple-quantum well layer, to generate a photon for emitting light.

14. The display panel of claim 13, wherein the P-type epitaxial layer is a P-gallium nitride (GaN), the N-type epitaxial layer is an N-GaN, and the first electrode is a positive electrode and is an aluminum electrode.

15. A display apparatus, comprising a display panel comprising a second substrate and a plurality of epitaxy structures arranged on the second substrate in an array, wherein
the plurality of epitaxy structures each comprise an epitaxial structure and a first metal layer that are sequentially stacked;
the second substrate comprises a circuit substrate and a second metal layer stacked on the circuit substrate; and
the first metal layer is bonded with the second metal layer, wherein both the first metal layer and the second metal layer are subjected to an activation treatment, and wherein
the first metal layer comprises a first metal sub-layer and a second metal sub-layer that are sequentially stacked, and the first metal sub-layer is stacked on the epitaxial structure; the second metal layer comprises a fifth metal sub-layer and a sixth metal sub-layer that are sequentially stacked, and the sixth metal sub-layer is stacked on the circuit substrate; and the second metal sub-layer is bonded with the fifth metal sub-layer; or the first metal layer comprises a first metal sub-layer, a second metal sub-layer, and a third metal sub-layer that are sequentially stacked, a part of the second metal sub-layer is exposed from the third metal sub-layer, and the first metal sub-layer is stacked on the epitaxial structure; the second metal layer comprises a fourth metal sub-layer, a fifth metal sub-layer, and a sixth metal sub-layer that are sequentially stacked, a part of the fifth metal sub-layer is exposed from the fourth metal sub-layer, and the sixth metal sub-layer is stacked on the circuit substrate; and the third metal sub-layer is bonded with the fourth metal sub-layer, and the part of the second metal sub-layer exposed is bonded with the part of the fifth metal sub-layer exposed.

16. The display apparatus of claim 15, wherein the circuit substrate defines a plurality of grooves, and the plurality of grooves each have a bottom provided with a first electrode;

the second metal layer stacked on the circuit substrate is filled in the groove and connected with the first electrode; and the first metal layer and the second metal layer form a conductor after bonding, and the epitaxial structure is electronically connected with the first electrode via the conductor.

17. The display apparatus of claim 16, wherein the epitaxial structure has a side away from the first metal layer, the side of the epitaxial structure is provided with a second electrode, and the epitaxial structure is electronically connected with the second electrode.

18. The display apparatus of claim 17, wherein the epitaxial structure comprises a P-type epitaxial layer, a multiple-quantum well layer, and an N-type epitaxial layer that are sequentially stacked, wherein the P-type epitaxial layer is located on the first metal layer and is electronically connected with the first electrode via the conductor;

the N-type epitaxial layer is electronically connected with the second electrode; and a hole of the P-type epitaxial layer and an electron of the N-type epitaxial layer are recombined at the multiple-quantum well layer, to generate a photon for emitting light.

* * * * *